(12) United States Patent
Oyamatsu (10) Patent No.: US 6,861,374 B2
(45) Date of Patent: Mar. 1, 2005

(54) SEMICONDUCTOR DEVICE HAVING PATTERNED SOI STRUCTURE AND METHOD FOR FABRICATING THE SAME

(75) Inventor: Hisato Oyamatsu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/792,836

(22) Filed: Mar. 5, 2004

(65) Prior Publication Data

US 2004/0169226 A1 Sep. 2, 2004

Related U.S. Application Data

(62) Division of application No. 10/075,465, filed on Feb. 15, 2002, now Pat. No. 6,724,046.

(30) Foreign Application Priority Data

Dec. 25, 2001 (JP) ......................................... 2001-392571

(51) Int. Cl.[7] ........................... H01L 21/31; H01L 21/30
(52) U.S. Cl. ........................ 438/761; 438/479; 438/761
(58) Field of Search .................................. 438/478, 479, 438/584, 758, 761, 763, 764, 778

(56) References Cited

U.S. PATENT DOCUMENTS 6,746,901 B2 * 6/2004 Kasahara et al. ........... 438/149

OTHER PUBLICATIONS

Robert Hannon, et al., "0.25'''m Merged Bulk DRAM and SOI Logic Using Patterned SOI", Symposium on VLSI Technology Digest of Technical Papers, 2000 (2 Pages).

* cited by examiner

*Primary Examiner*—David Zarneke
*Assistant Examiner*—Scott B Geyer
(74) *Attorney, Agent, or Firm*—Oblon, Spivak, McClelland, Maier & Neustadt, P.C.

(57) ABSTRACT

A method for fabricating a semiconductor device, including forming a first insulation film, a first semiconductor layer, and a second insulation film in sequence in first to third regions of a semiconductor substrate; removing the first insulation film, the first semiconductor layer, and the second insulation film in the first region and the second insulation film in the third region; selectively forming a second semiconductor layer in the first region of the semiconductor substrate and on the first semiconductor layer in the third region; and removing the second insulation film.

10 Claims, 13 Drawing Sheets

SEMICONDUCTOR DEVICE HAVING PATTERNED SOI STRUCTURE AND METHOD FOR FABRICATING THE SAME

CROSS-REFERENCE TO RELATED APPLICATIONS

This application claims benefit of priority under 35 USC § 120 and is a divisional of U.S. Ser. No. 10/075,465 filed, Feb. 15, 2002 now U.S. Pat. No. 6,724,046 which is based upon and claims the benefit of priority from the prior Japanese Patent Application No. 2001-392571, filed Dec. 25, 2001, the entire contents of which are incorporated herein by reference.

BACKGROUND OF THE INVENTION

1. Field of the Invention

The present invention relates to a semiconductor device having a patterned SOI (Silicon On Insulator) structure and a method for fabricating the semi-conductor device. More specifically, the invention relates to a technique for use in a system LSI using an SOI substrate.

2. Description of the Related Art

Today we enter the broadband age in accordance with the development of computer and networks. In order to process a large amount of data on a network, a variety of semiconductor devices have to be integrated on an LSI at high densities. A try to use SOI in such an LSI requiring a high degree of integration is made. The SOI has conventionally been known widely as a structure in which a silicon layer is formed on an insulation film. Semiconductor elements (SOI elements) formed on the SOI are low in parasitic capacitance and can operate at high speed. It is thus expected that a higher-performance LSI will be achieved by the use of SOI elements.

For example, a system LSI embedded a DRAM (Dynamic Random Access Memory) using SOI elements is proposed by R. Hannon et al., "0.25 µm Merged Bulk DRAM and SOI logic using Patterned SOI," 2000 Symposium on VLSI Technology Digest of Technical Papers.

Whether the use of SOI elements in a system LSI is good or not varies from circuit to circuit contained in the system LSI. It is not desirable to use an SOI element at least in the DRAM cell. This is because the SOI element has a floating body effect inherent therein. It is therefore desirable to form a DRAM cell of non-SOI elements and form other logic circuits, which perform a digital operation, of SOI elements. More specifically, SOI regions are partially formed on a silicon substrate. This structure is referred to as a patterned SOI structure. It is desirable to form a DRAM cell in a non-SOI region (bulk region) and form a peripheral circuit in an SOI region.

A method for fabricating the above patterned SOI structure will now be described with reference to FIGS. 1A to 1D. FIGS. 1A to 1D are cross-sectional views showing steps of fabricating the SOI structure in sequence.

Figure 1A:
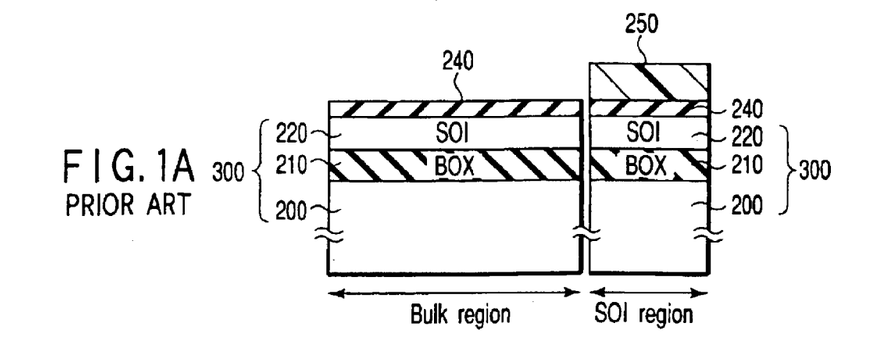
FIGS. 1A to 1D are cross-sectional views showing in sequence a process of fabricating a prior art semiconductor device.
Figure 1B:
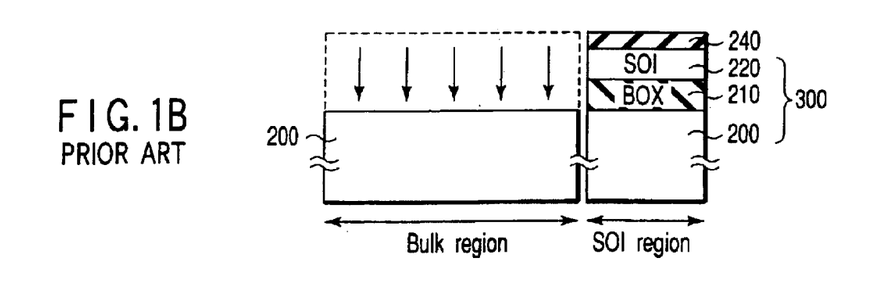
Figure 1C:
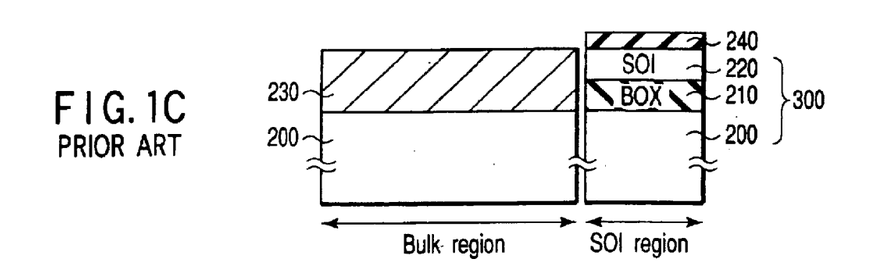
Figure 1D:
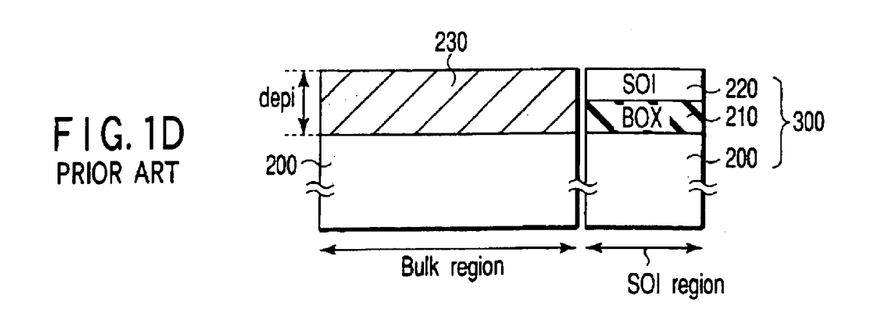

As shown in FIG. 1A, a silicon oxide film 240 is formed on an SOI substrate 300. The SOI substrate 300 includes a silicon substrate 200, a BOX (Buried Oxide) layer 210, and an SOI layer 220. Resist 250 is applied onto the silicon oxide film 240 and then left only on the region that is to serve as an SOI region. As shown in FIG. 1B, the silicon oxide film 240, SOI layer 220, and BOX layer 210 in the bulk region are etched using the resist 250 as a mask to thereby expose the silicon substrate 200. After that, the resist 250 is removed. As illustrated in FIG. 1C, a silicon layer 230 is selectively formed on the silicon substrate 200 by epitaxial growth. Since the silicon oxide film 240 is exposed in the SOI region, the silicon layer 230 grows only on the silicon substrate 200 in the bulk region. As shown in FIG. 1D, the silicon oxide film 240 remaining in the SOI region is removed.

The above-described method can create a patterned SOI structure in which SOI partially exists on the silicon substrate. After that, for example, a logic circuit is formed on the SOI layer 220 in the SOI region. Further, for example, a DRAM cell is formed on the silicon layer 230 in the bulk region. The SOI and non-SOI elements are used selectively according to the characteristic of semiconductor elements, with the result that a high-speed, high-performance system LSI can be achieved.

In the foregoing fabricating method, however, it was sometimes very difficult to measure the thickness of the silicon layer 230 formed in the bulk region.

The deposition rates in a deposition step of a semiconductor fabricating process are not always the same even though the deposition conditions are set to the same. It is rather usual that the deposition rates vary even though the deposition conditions are the same. This is caused by subtle change of external environment (temperature, pressure, humidity) and internal environment (state of inside of chamber, state of sensor), the surface state of a semiconductor wafer, and the like while a deposition device is operating. Consequently, the deposition rate (film thickness) of the deposition conditions needs to be measured. The deposition conditions need to be optimized by feeding the measurement result back to the deposition conditions of the next deposition. Especially in an SoC (System on Chip) type high-performance system LSI, thickness control is very important in increasing the accuracy of photolithography process. For example, in the patterned SOI structure, it is desirable to reduce a difference in level between the bulk and SOI regions as much as possible. In other words, the growth conditions of the silicon layer 230 have to be controlled such that the top surface of the silicon layer 230 in the bulk region and that of the SOI layer 220 in the SOI region are flush with each other. To do this, the thickness depi of the silicon layer 230 should be measured. Naturally, the thickness is measured by non-destructive inspection in order to improve yields. For example, an optical method using light reflected by the boundary between respective layers is employed.

In the patterned SOI structure shown in FIG. 1D, however, the silicon layer 230 whose thickness is to be measured is made of the same material as that of the underlying substrate 200. In other words, there is hardly a difference in optical constant between them. It was therefore very difficult to measure the thickness of the silicon layer 230. Consequently, the result of deposition obtained under the deposition conditions could not be reflected in its subsequent deposition; thus, there was a case where the fabricating yields of the system LSI decreased.

A method for fabricating a semiconductor device according to an aspect of the present invention comprises:

forming a first insulation film, a first semiconductor layer, and a second insulation film in sequence in first to third regions of a semiconductor substrate;

removing the first insulation film, the first semiconductor layer, and the second insulation film in the first region and the second insulation film in the third region;

selectively forming a second semiconductor layer in the first region of the semiconductor substrate and on the first semiconductor layer in the third region; and removing the second insulation film.

DETAILED DESCRIPTION OF THE INVENTION

Figure 2:
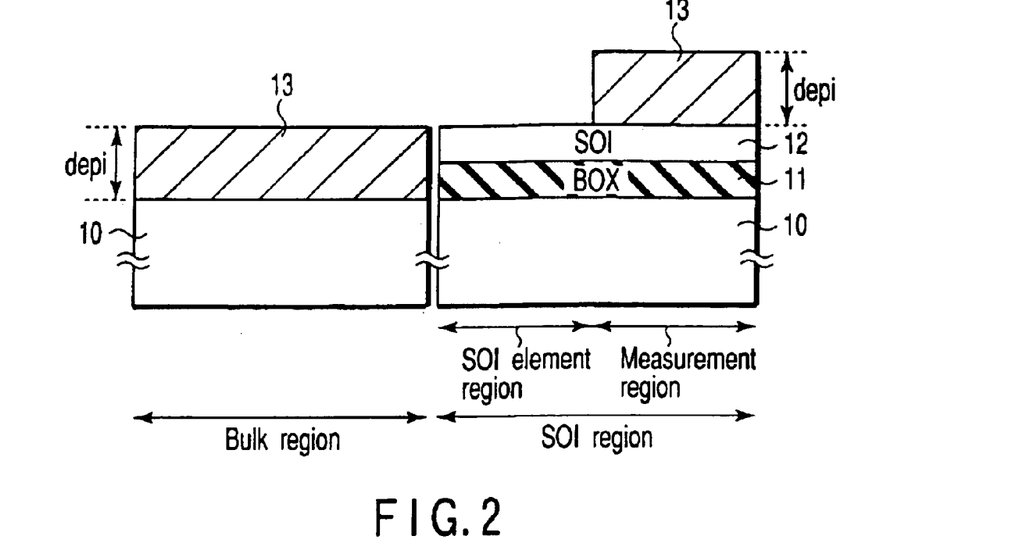
FIG. 2 is a cross-sectional view of a semi-conductor device according to a first embodiment of the present invention.

A semiconductor device according to a first embodiment of the present invention and a method for fabricating the semiconductor device will now be described with reference to FIG. 2. FIG. 2 is a cross-sectional view of the semiconductor device having a patterned SOI structure.

As illustrated in FIG. 2, a BOX layer 11 is provided on a silicon substrate 10 in an SOI region of the semiconductor device, and a semiconductor layer of, e.g., silicon, or an SOI layer 12 is provided on the BOX layer 11. The BOX layer 11 is an insulation film of a silicon oxide film or the like. On the other hand, a silicon layer 13 is formed on the silicon substrate 10 in a bulk region having no SOI. The silicon layer 13 in the bulk region is so formed that it is substantially flush with the SOI layer 12. In such a patterned SOI structure, another silicon layer 13 is formed on the SOI layer 12 in the SOI region.

The above patterned SOI structure can produce the advantage (1) that thickness measurement can be simplified. More specifically, the thickness depi of the silicon layer 13 can easily be measured. The silicon layer 13 is formed on the silicon substrate 10 in the bulk region and on the SOI layer 13 in the SOI region. In other words, the layers underlying the silicon layers 13 formed in the respective regions differ from each other. Since, however, their materials are both silicon, the thicknesses of the silicon layers 13 in the respective regions can basically be considered to be the same. Unlike in the prior art, therefore, the thickness of the silicon layer 13 can be measured not in the bulk region but in the SOI region. The SOI region includes both a region with the silicon layer 13 and a region without the silicon layer 13. The former region is referred to as a measurement region and the latter region is referred to as an SOI element region. Since the BOX layer 11 underlies the SOI layer 12, there is a wide difference in optical constant between them. The thickness of the SOI layer 12 can thus be measured in the SOI element region. In the measurement region, the sum of the thicknesses of the silicon layer 13 and the SOI layer 12 can be measured. By subtracting the measurement result in the SOI element region from that in the measurement region, the thickness of the silicon layer 13 can be calculated.

According to the semiconductor device described above, the thickness measurement can be simplified. Since the thickness of the silicon layer 13 can be measured, the deposition conditions (deposition atmosphere, temperature, etc.) of the silicon layer 13 can be optimized. As a result, the semiconductor device can be improved in fabricating yields.

A method for fabricating the above patterned SOI structure will now be described with reference to FIGS. 3A to 3E. FIGS. 3A to 3E are cross-sectional views showing in sequence a process of fabricating the patterned SOI structure.

Figure 3A:
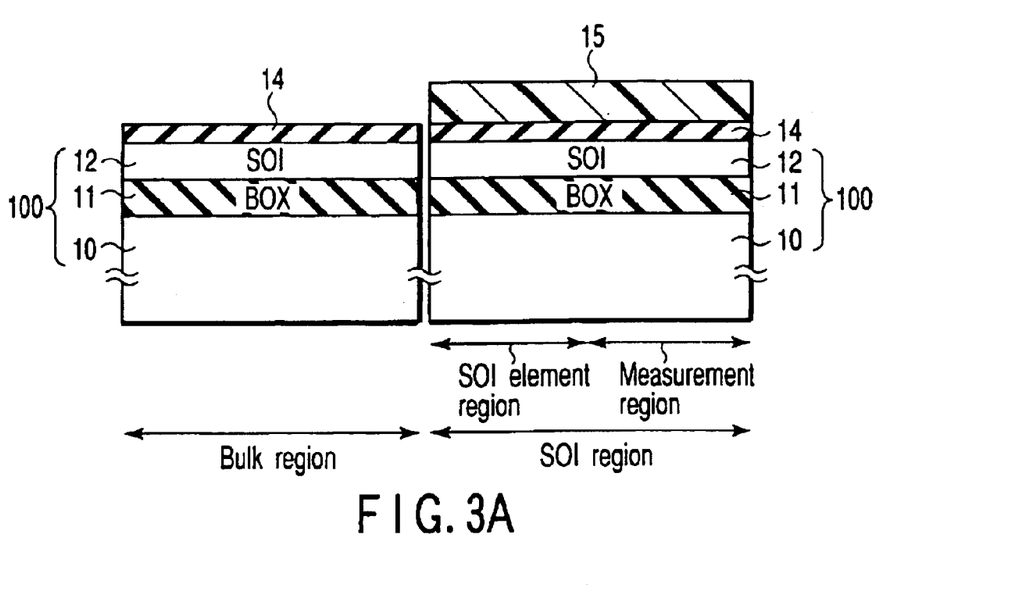
FIGS. 3A to 3E are cross-sectional views showing in sequence a process of fabricating the semiconductor device according to the first embodiment of the present invention.

As illustrated in FIG. 3A, a silicon oxide film 14 is formed on an SOI substrate 100 by thermal oxidation, LP-CVD (Low Pressure-Chemical Vapor Deposition), or the like. The SOI substrate 100 includes a silicon substrate 10, a BOX layer 11 formed on the silicon substrate 10, and an SOI layer 12 formed on the BOX layer 11. The SOI substrate 100 can be formed by sticking two silicon substrates on each other or by SIMOX (Separation by Implanted Oxygen). Then, resist 15 is applied onto the silicon oxide film 14. The resist 15 is patterned by photolithography to leave the resist 15 only on the silicon oxide film 14 of the SOI region.

Figure 3B:
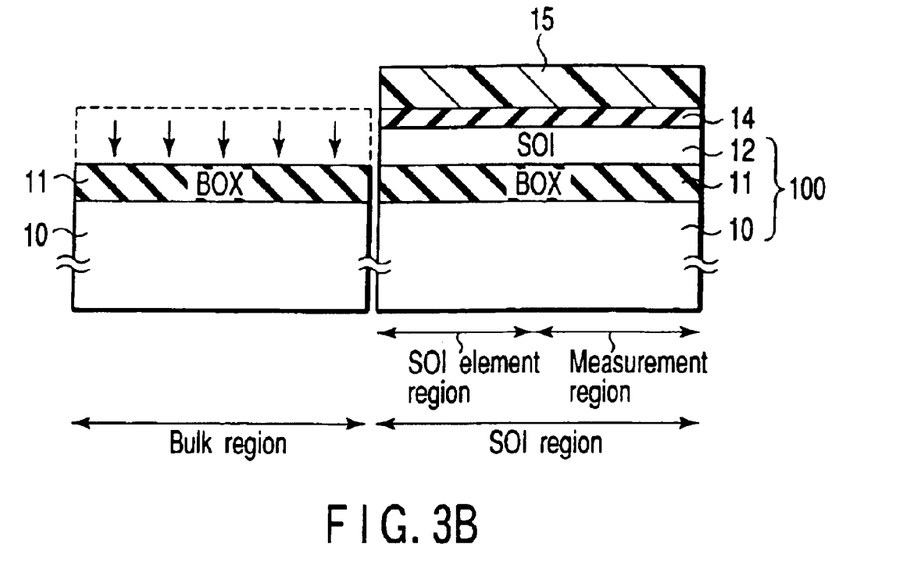

As shown in FIG. 3B, the silicon oxide film 14 and SOI layer 12 in the bulk region are removed by etching using the resist 15 as a mask. The BOX layer 11 is therefore exposed in the bulk region.

Figure 3C:
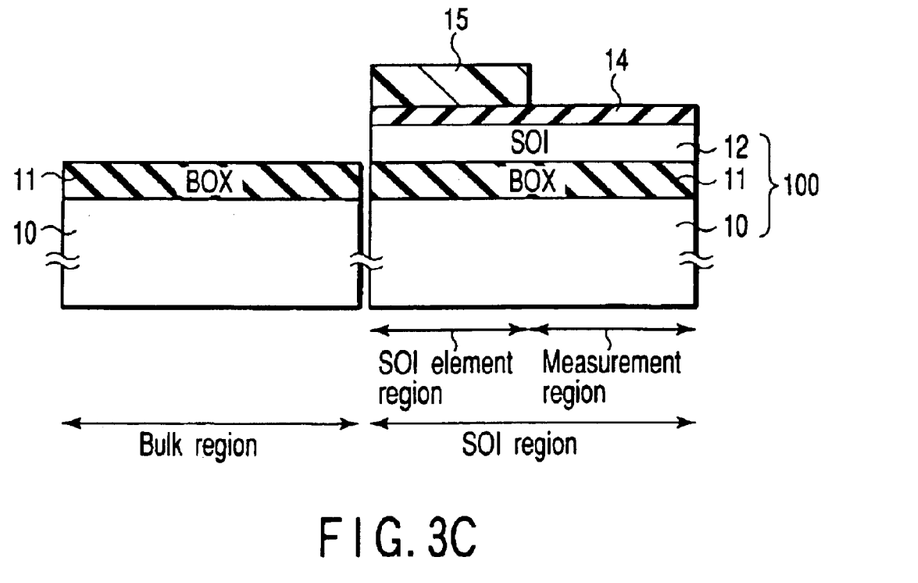

As illustrated in FIG. 3C, the resist 15 remaining in the SOI region is patterned to remove part of the resist 15 that is to serve as a measurement region.

Figure 3D:
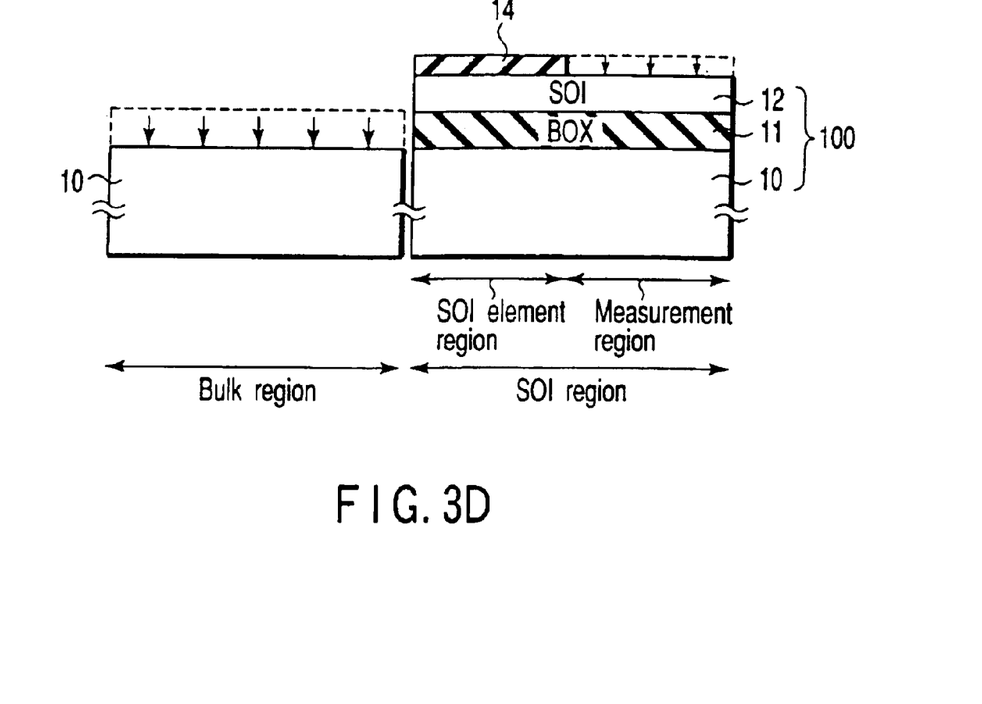

As illustrated in FIG. 3D, the silicon oxide film 14 in the SOI region and the BOX layer 11 in the bulk region are removed by etching using the resist 15 as a mask; consequently, the silicon substrate 10 is exposed in the bulk region. The SOI region includes both a region (SOI element region) in which the silicon oxide film 14 is exposed and a region (measurement region) in which the SOI layer 12 is exposed. After that, the resist 15 is removed by ashing or the like.

Figure 3E:
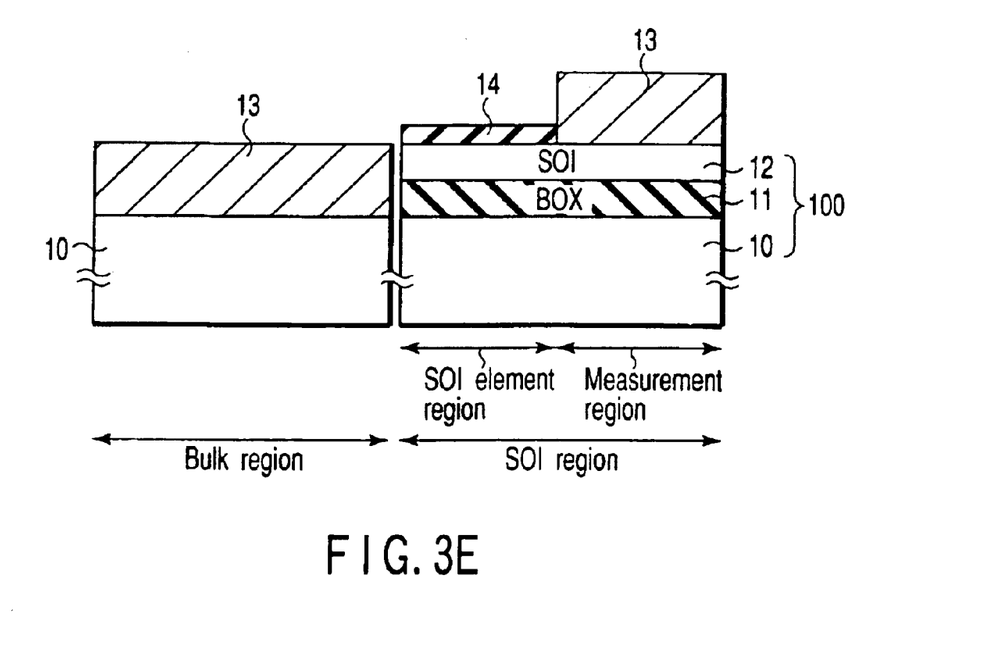

As shown in FIG. 3E, a silicon layer 13 is formed on the silicon substrate 10 in the bulk region and on the SOI layer 12 in the SOI region by epitaxial growth. In this time, the silicon oxide film 14 exists in the SOI element region; therefore, the silicon layer 13 is not formed in the SOI element region. The silicon layer 13 selectively grows only on the silicon substrate 10 in the bulk region and on the SOI layer 12 in the measurement region.

After that, the silicon oxide film 14 is removed from the SOI region. Semiconductor elements are formed in the bulk and SOI regions by a known method, thus completing a semiconductor device.

The silicon layer 13 can be removed from the measurement region after its thickness is measured. Needless to say, the silicon layer 13 can be left in the SOI region and a semiconductor element can be formed on the silicon layer 13. The silicon oxide film 14 is formed in order to selectively grow the silicon layer 13. In other words, the silicon oxide film 14 acts as a mask against the deposition of the silicon layer 13. Therefore, the silicon oxide film 14 can be replaced with another insulation film, such as a silicon nitride film, and a conductive film.

Figure 4:
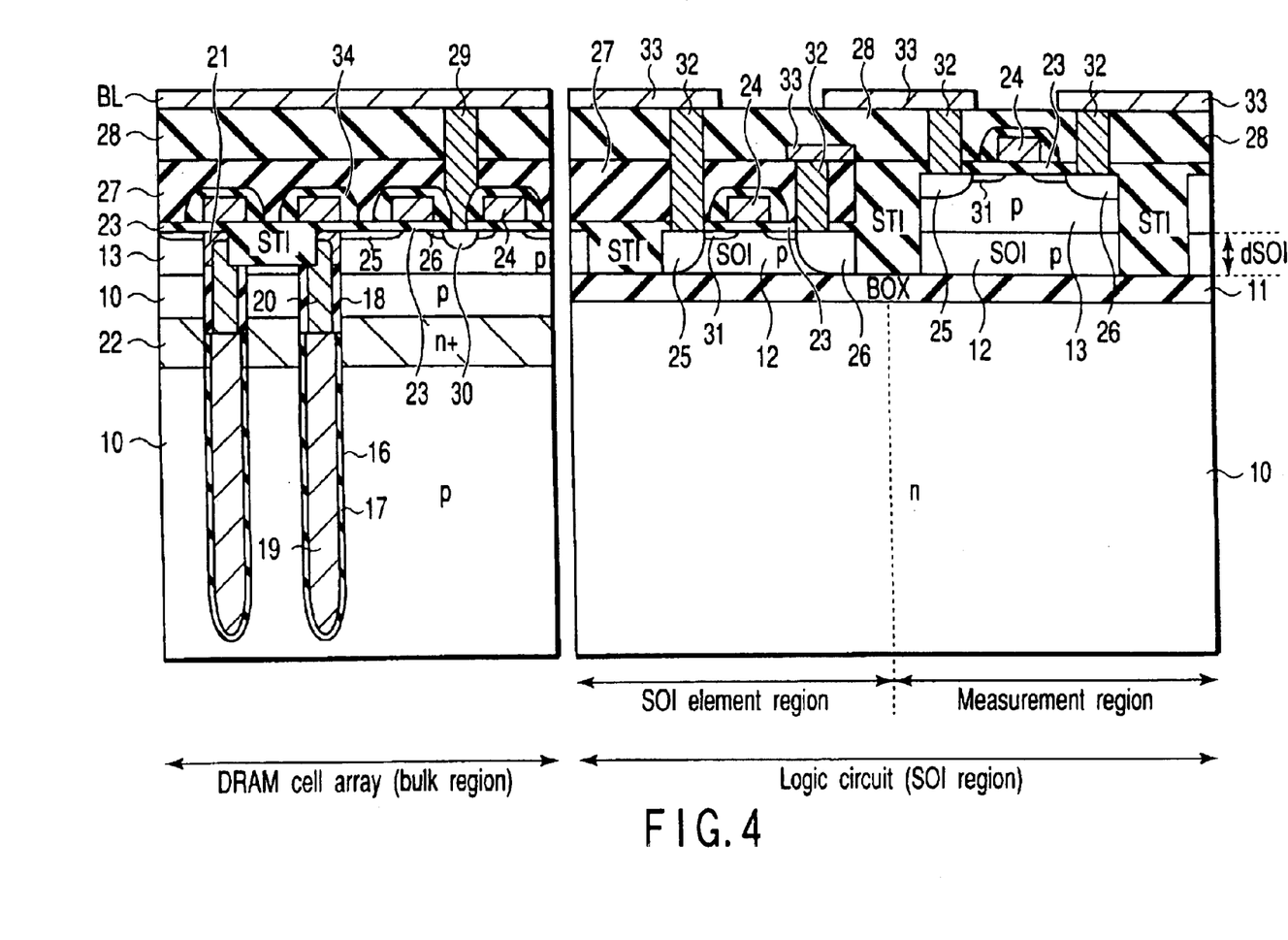
FIG. 4 is a cross-sectional view of a semiconductor device according to a second embodiment of the present invention.

A semiconductor device according to a second embodiment of the present invention will now be described with reference to FIG. 4. FIG. 4 is a cross-sectional view of a system LSI embedded a DRAM using a patterned SOI structure. In the second embodiment, a DRAM cell array is formed in the bulk region of the foregoing first embodiment and another logic circuit is formed in the SOI region thereof. First, a structure of the DRAM cell array formed in the bulk region will be described in brief.

As shown in FIG. 4, a trench 16 is provided in a p-type silicon layer 13 and a p-type silicon substrate 10. A capacitor insulation film 17 is formed on the inner surface of the trench 16, excluding the upper part of the surface. Further, a collar oxide film 18, which is thicker than the capacitor insulation film 17, is formed not on the capacitor insulation film 17 but on the inner surface of the trench 16 excluding a portion close to the opening of the trench 16. A storage node electrode 19 is buried halfway into the trench 16, and a conductive layer 20 is formed on the storage node electrode 19. Further, a low-resistance conductive layer 21 is provided close to the opening of the trench 16. An n$^+$-type impurity diffusion layer 22 is formed in the silicon substrate 10 in contact with the capacitor insulation film 17. The n$^+$-type impurity diffusion layer 22 serves as a plate electrode. Thus, a trench type cell capacitor having the above structure is obtained.

A gate electrode 24 is formed on the silicon layer 13 with a gate insulation film 23 interposed therebetween, and an insulation film 34 is provided so as to surround the gate electrode 24. Further, n$^+$-type source and drain regions 25 and 26 are provided in the surface area of the silicon layer 13 to thereby form a cell transistor. The source region 25 of the cell transistor is electrically connected to the conductive layer 21 of the cell capacitor. A plurality of DRAM cells each including a cell transistor and a cell capacitor as described above are provided in the DRAM cell array. Two DRAM cells are arranged in each of element regions that are electrically isolated from each other by an element isolation region STI, and two DRAM cells have a drain region 26 in common.

Interlayer insulation films 27 and 28 are formed on the silicon layer 13 so as to cover the DRAM cell described above. A bit line contact plug 29 is provided in the interlayer insulation films 27 and 28 so as to reach the drain region 26 from the surface of the film 28. A high impurity concentration n$^{++}$-type contact region 30 is provided in part of the drain region 26 which contacts the bit line contact plug 29. A bit line BL, which is electrically connected to the bit line contact plug 29, is formed on the interlayer insulation film 28.

The arrangement of the logic circuit formed in the SOI region will now be described. As illustrated in FIG. 4, a MOS transistor included in the logic circuit has a gate insulation film 23, a gate electrode 24, and source and drain regions 25 and 26, like the cell transistor. The MOS transistor also has an LDD region 31. The gate electrode 24 of the MOS transistor in the SOI element region is formed on the SOI layer 12 with the gate insulation film 23 interposed therebetween. The source and drain regions 25 and 26 and LDD region 31 of the SOI element region are provided in the SOI layer 12. The source and drain regions 25 and 26 are provided so as to reach the BOX layer 11 from the surface of the SOI layer 12. The gate electrode 24 of the MOS transistor in the measurement region is formed on the silicon layer 13, which is formed on the SOI layer 12, with the gate insulation film 23 interposed therebetween. The source and drain regions 25 and 26 and LDD region 31 in the measurement region are provided in the silicon layer 13 to such a depth as not to reach the BOX layer 11. The MOS transistors so arranged are electrically isolated from each other by the element isolation region STI.

An interlayer insulation film 27 is formed on the SOI layer 12 so as to cover the MOS transistors described above. Another interlayer insulation film 28 is formed on the interlayer insulation film 27 and the silicon layer 13. A contact plug 32, which is connected to the source and drain regions, is provided in the interlayer insulation films 27 and 28. A wiring layer 33 is formed on the interlayer insulation films 27 and 28 and electrically connected to the contact plug 32.

The LSI with the above structure can produce the following advantages (2) and (3) as well as the advantage (1) of the first embodiment. The advantage (2) is that the floating body effect of the MOS transistor in the measurement region can be eliminated and the advantage (3) is that the LSI can be improved in degree of integration.

Figure 5A:
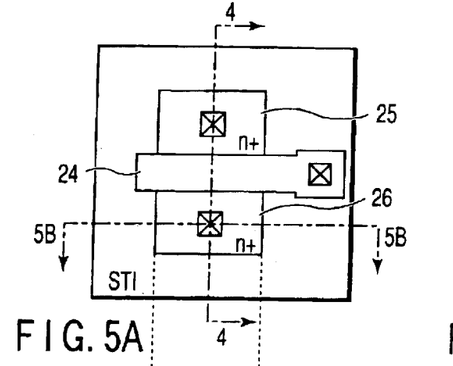
FIG. 5A is a plan view of an SOI element region.
Figure 5B:
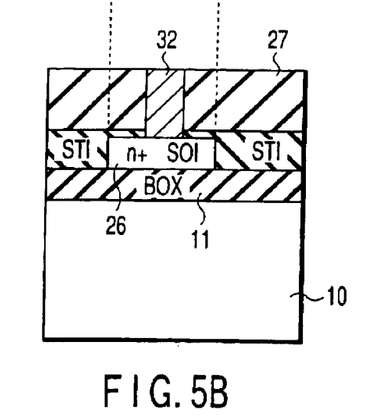
FIG. 5B is a cross-sectional view taken along line 5B—5B in FIG. 5A.
Figure 6A:
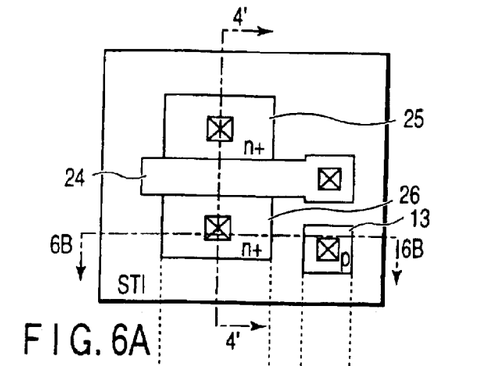
FIG. 6A is a plan view of an SOI element region.
Figure 6B:
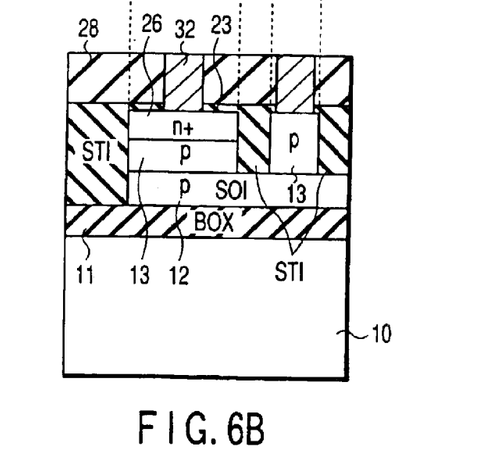
FIG. 6B is a cross-sectional view taken along line 6B—6B in FIG. 6A.

First, the advantage (2) will be described with reference to FIGS. 5A and 5B and FIGS. 6A and 6B. FIG. 5A is a plan view of the SOI element region shown in FIG. 4, and FIG. 5B is a cross-sectional view taken along line 5B—5B in FIG. 5A. FIG. 4 corresponds to the cross-sectional view taken along line 4—4 in FIG. 5A. FIG. 6A is a plan view of the measurement region shown in FIG. 4, and FIG. 6B is a cross-sectional view taken along line 6B—6B in FIG. 6A. FIG. 4 corresponds to the cross-sectional view taken along line 4'—4' in FIG. 6A.

The SOI element region will now be described. As shown in FIG. 5A, the element region in which the MOS transistor is formed is surrounded by the element isolation region STI. The source and drain regions 25 and 26 are formed so as to reach the BOX layer 11. As shown in FIGS. 4 and 5B, the element isolation region STI is also formed so as to reach the BOX layer 11. The potential of the p-type SOI region, or the back gate potential of the MOS transistor cannot be set from outside. Consequently, the back gate potential of the MOS transistor becomes a floating potential. This is a floating body effect. The MOS transistor using the SOI structure can reduce parasitic capacitance since the source and drain regions 25 and 26 contact the BOX layer 11. On the other hand, the back gate potential of the MOS transistor cannot be fixed. If the back gate potential is a floating potential, the gate voltage-drain current characteristic deteriorate especially during the analog operation. This is because the coupling of variations in gate voltage influences the back gate potential. Therefore, the MOS transistor formed in the SOI region is limited to a MOS transistor that performs a digital operation.

Then, the measurement region will be described. As illustrated in FIG. 6A, the element region in which the MOS transistor is formed is surrounded by the element isolation region STI, like the SOI element region. However, the source and drain regions 25 and 26 are formed so as not to reach the BOX layer 11, unlike the SOI element region. A shown in FIG. 6B, therefore, the element isolation region STI need not be formed so as to reach the BOX layer 11. If, therefore, part of the element isolation region STI is formed so as not to reach the BOX layer 11 and the silicon layer 13 is formed in the element isolation region STI so as to reach the SOI layer 12, and a back gate potential can be set at a predetermined value by applying a potential to the silicon layer 13. The potential applied to the silicon layer 13 is applied to the back gate of the MOS transistor through the SOI layer 12 located directly under the element isolation region STI, the SOI layer 12 located directly under the source region 25 or drain region 26, and the p-type layer 13.

In the foregoing LSI according to the second embodiment, the back gate bias of the MOS transistor formed in the measurement region can be fixed, and the floating body effect can be eliminated. Consequently, a MOS transistor that can perform an analog operation as well as a digital operation can be formed in the SOI region. The LSI can thus be improved in degree of freedom of design.

Figure 7A:
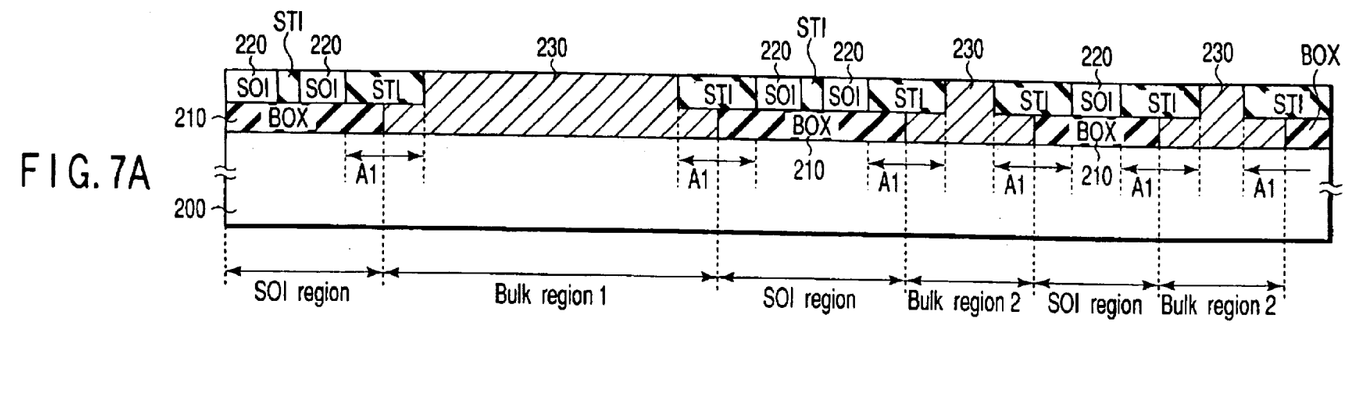
FIG. 7A is a cross-sectional view of a prior art semiconductor device.
Figure 7B:
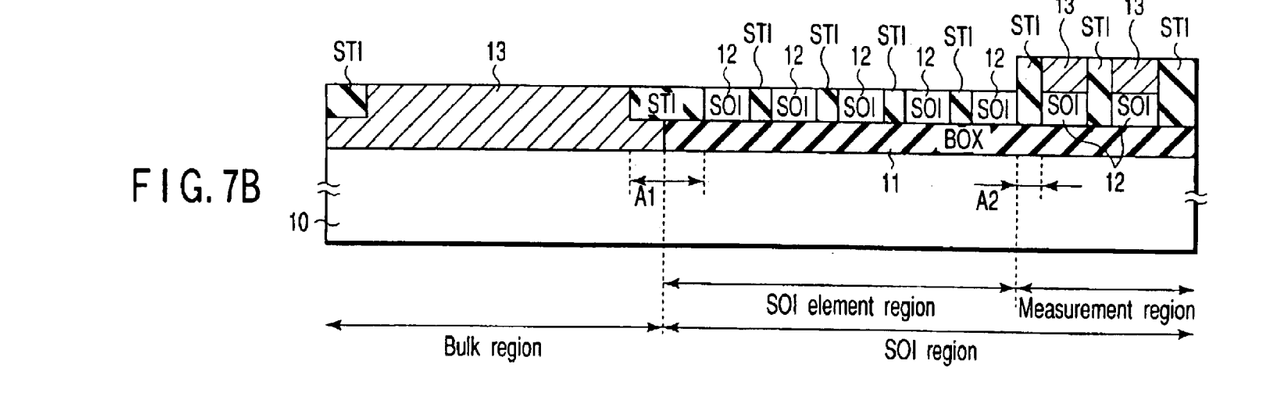
FIG. 7B is a cross-sectional view of the semi-conductor device according to the second embodiment of the present invention.

The advantage (3) will now be described with reference to FIGS. 7A and 7B. FIG. 7A is a cross-sectional view showing a structure of the substrate of a prior art LSI and FIG. 7B is a cross-sectional view showing a structure of the substrate of the LSI according to the second embodiment of the present invention as a model.

In the prior art structure, as shown in FIG. 7A, bulk regions and SOI regions are mixed in the silicon substrate 200. The bulk region 1 includes a DRAM cell array and the bulk region 2 includes a peripheral circuit to perform an analog operation. The SOI regions include a logic circuit to perform a digital operation and the like. The bulk and SOI regions are electrically isolated from each other by the element isolation region STI.

As has been described in the BACKGROUND OF THE INVENTION, the silicon layer 230 in the bulk region is formed on the silicon substrate by selective growth. The BOX layer 210 and SOI layer 220 surround a region in which the silicon layer 230 is formed. When the silicon layer 230 grows, it is subjected to stress from the BOX and SOI layers 210 and 220 and its crystallization deteriorates. It is thus unfavorable to form a semiconductor element in a boundary between the bulk and SOI regions. The region A1 shown in FIG. 7A corresponds to the boundary between the bulk and SOI regions, which is difficult to use as a region where the semiconductor element is formed.

Since the bulk region 1 is a region where, e.g., a DRAM cell array is formed, its area is relatively large. The ratio of the area of the region A1 to that of the bulk region 1 is small. Assuming that the width of the bulk region 1 is 1 mm and the area of the region A1 is 10 $\mu$m, the percentage of the region A1 occupied in the bulk region 1 is only 1%.

However, the bulk region 2 is a region where a peripheral circuit is formed and used for forming several MOS transistors as the case may be. Therefore, the ratio of the area of the region A1 to that of the bulk region 2 is very large. If the width of the bulk region 2 is 20 $\mu$m, the percentage of the region A1 occupied in the bulk region 2 is 50%. Consequently, the more the SOI element is used, the more the useless regions A1. The area of the substrate cannot be used effectively to prevent the LSI from improving in integration density.

According to the second embodiment of the present invention, a peripheral circuit that performs an analog operation can be formed in the measurement region. As has been described in the first embodiment, the silicon layer 13 in the measurement region is formed on the SOI layer 12 by selective growth. The silicon oxide film 14 surrounds a region where the silicon layer 13 is formed. However, the silicon oxide film 14 is simply formed to prevent the silicon layer 13 from growing on the SOI element region. The silicon oxide film 14 is therefore relatively thin. Thus, the silicon layer 13 is hardly subjected to stress from the silicon oxide film 14 when the silicon layer 13 grows. In other words, the region whose crystallization is degraded by stress is very narrow. As illustrated in FIG. 7B, a region A1 of the boundary between the bulk and SOI regions has an area that is almost the same as that of the region A1 of the prior art structure described above. However, the area of a region A1 between the SOI element region and the measurement region is much smaller than that of the region A1 of the boundary between the bulk and SOI regions. Unlike in the prior art structure, the bulk and SOI regions are not mixed but the analog elements other than the SOI element and DRAM cell array are integrated in the SOI region. Thus, the percentage of useless regions A1 occupied in the whole area can greatly be decreased and the integration density of the LSI can be improved very rapidly.

Figure 8:
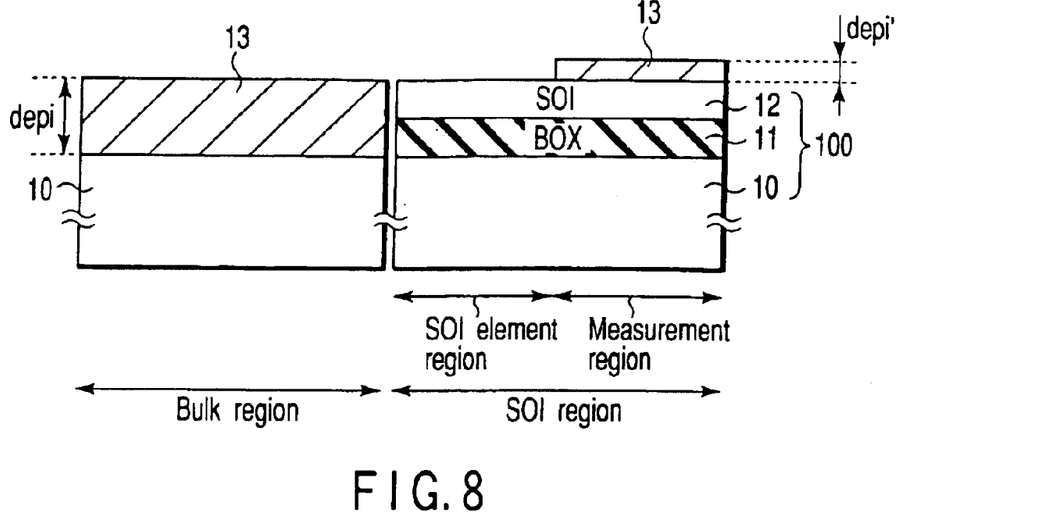
FIG. 8 is a cross-sectional view of a semi-conductor device according to a third embodiment of the present invention.

A semiconductor device according to a third embodiment of the present invention will now be described with reference to FIG. 8. FIG. 8 is a cross-sectional view of a semiconductor device having a patterned SOI structure.

Figure 9:
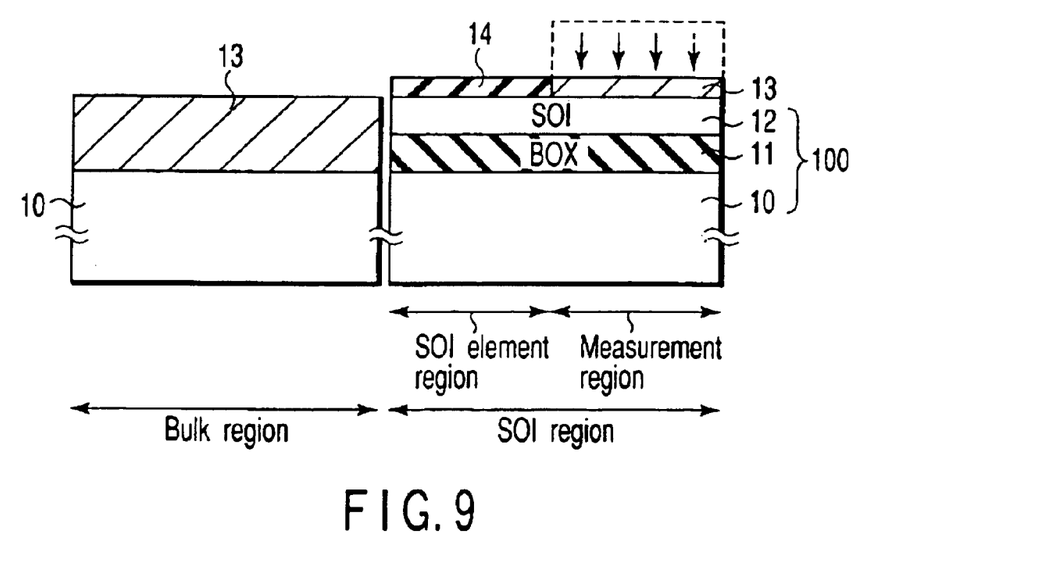
FIG. 9 is a cross-sectional view showing part of a process of fabricating the semiconductor device according to the third embodiment of the present invention.

As shown in FIG. 8, in the patterned SOI structure according to the third embodiment, the thickness depi' of the silicon layer 13 in the measurement region is set smaller than the thickness depi of the silicon layer 13 in the bulk region. A method for fabricating the structure shown in FIG. 8 will be described with reference to FIG. 9. FIG. 9 is a cross-sectional view showing part of a process of fabricating the semiconductor device shown in FIG. 8.

First, the structure shown in FIG. 3E is formed according to the process described in the first embodiment. After that, as shown in FIG. 9, the silicon layer 13 in the measurement region is polished and removed by CMP (Chemical Mechanical Polishing) using the silicon oxide film 14 remaining in the SOI element region as a stopper. Then, the silicon oxide film 14 is removed from the SOI element region by etching, thus obtaining the structure shown in FIG. 8.

In the patterned SOI structure according to the third embodiment, the thickness of the silicon layer 13 in the SOI region can be measured when the structure shown in FIG. 3E is formed. The advantage (1) described in the first embodiment can thus be obtained. Another advantage (4) that photolithography precision can be improved is obtained together with the advantage (1). After the structure shown in FIG. 8 is obtained, a semiconductor element is formed in the bulk and SOI regions and an interlayer insulation film (not shown) is formed on the silicon layer 13 and SOI layer 12. Then, a metal wiring layer (not shown) connected to the semiconductor element is formed on the interlayer insulation film. The metal wiring layer is usually formed by patterning a metal layer by photolithography. The patterning precision in the photolithography process greatly depends upon the flatness of the underlying layer of the metal wiring layer. In other words, the patterning precision deteriorates and miniaturization of the semiconductor element becomes difficult if there is a great step on the surface of the interlayer insulation film that is an underlying layer of the metal wiring layer. The step caused on the surface of the interlayer insulation film is influenced by a step on the silicon layer 13 and SOI layer 12 serving as an underlying layer of the interlayer insulation film. According to the third embodiment of the present invention, the silicon layer 13 remaining in the measurement region is polished; thus, a step between the surfaces of the bulk region and the SOI element region is small. Consequently, the flatness of the interlayer insulation film provided on the silicon layer 13 and SOI layer 12 is secured. As a result, the precision of patterning on the metal wiring layer on the interlayer insulation film is improved, which contributes to further miniaturization of the semiconductor device.

Figure 10:
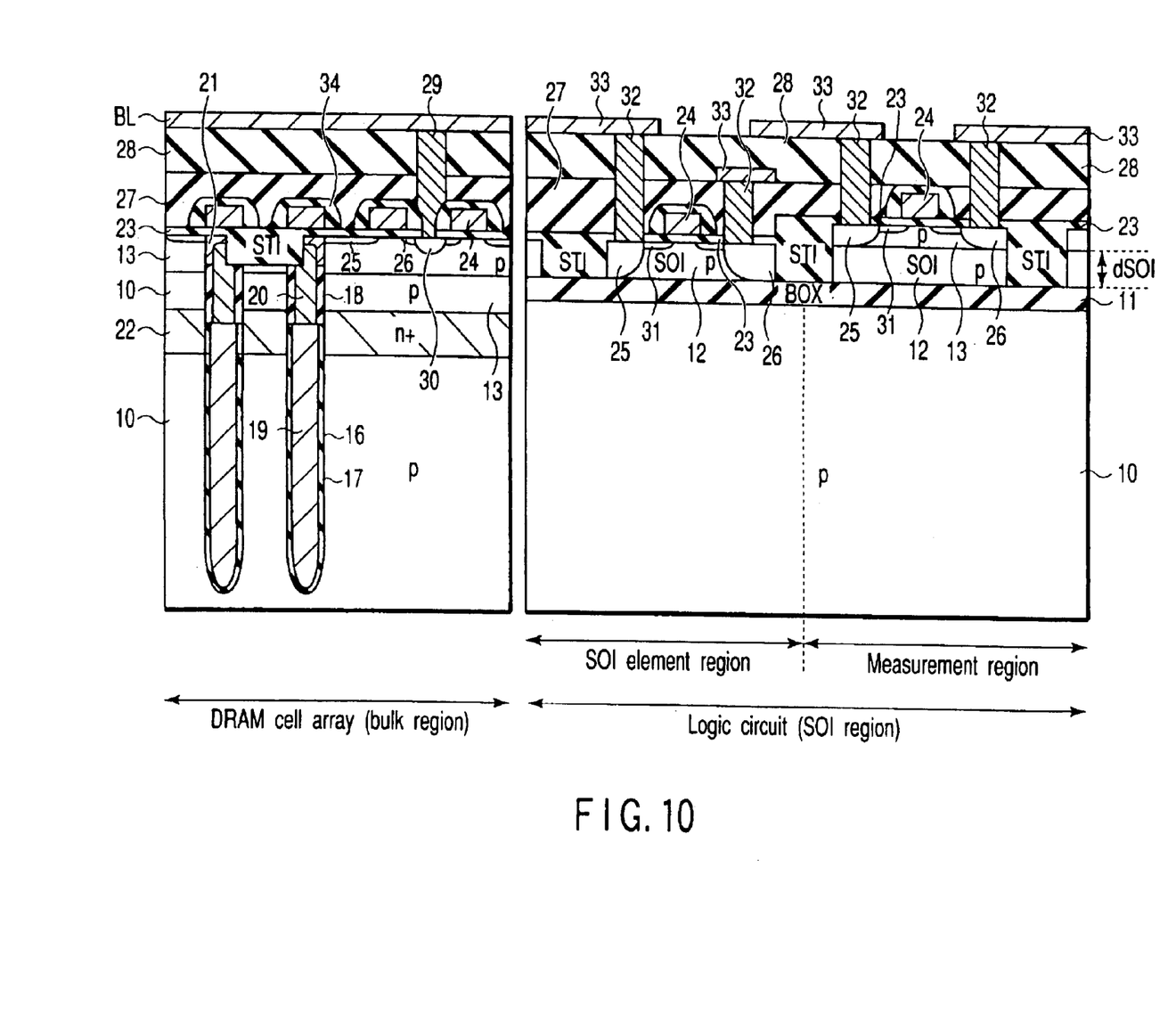
FIG. 10 is a cross-sectional view of a semi-conductor device according to a fourth embodiment of the present invention.

A semiconductor device according to a fourth embodiment of the present invention will now be described with reference to FIG. 10. FIG. 10 is a cross-sectional view of a system LSI embedded a DRAM.

As illustrated in FIG. 10, the fourth embodiment is obtained by applying the second embodiment to the third embodiment. More specifically, a DRAM cell array is formed in the bulk region of the third embodiment and another logic circuit is formed in the SOI region. Since FIG. 10 is therefore directed to a system LSI in which the silicon layer 13 of the measurement region shown in FIG. 4 is decreased in thickness, its description is omitted.

According to the fourth embodiment, the advantages (1) to (4) described in the first to third embodiments can be obtained.

Figure 11:
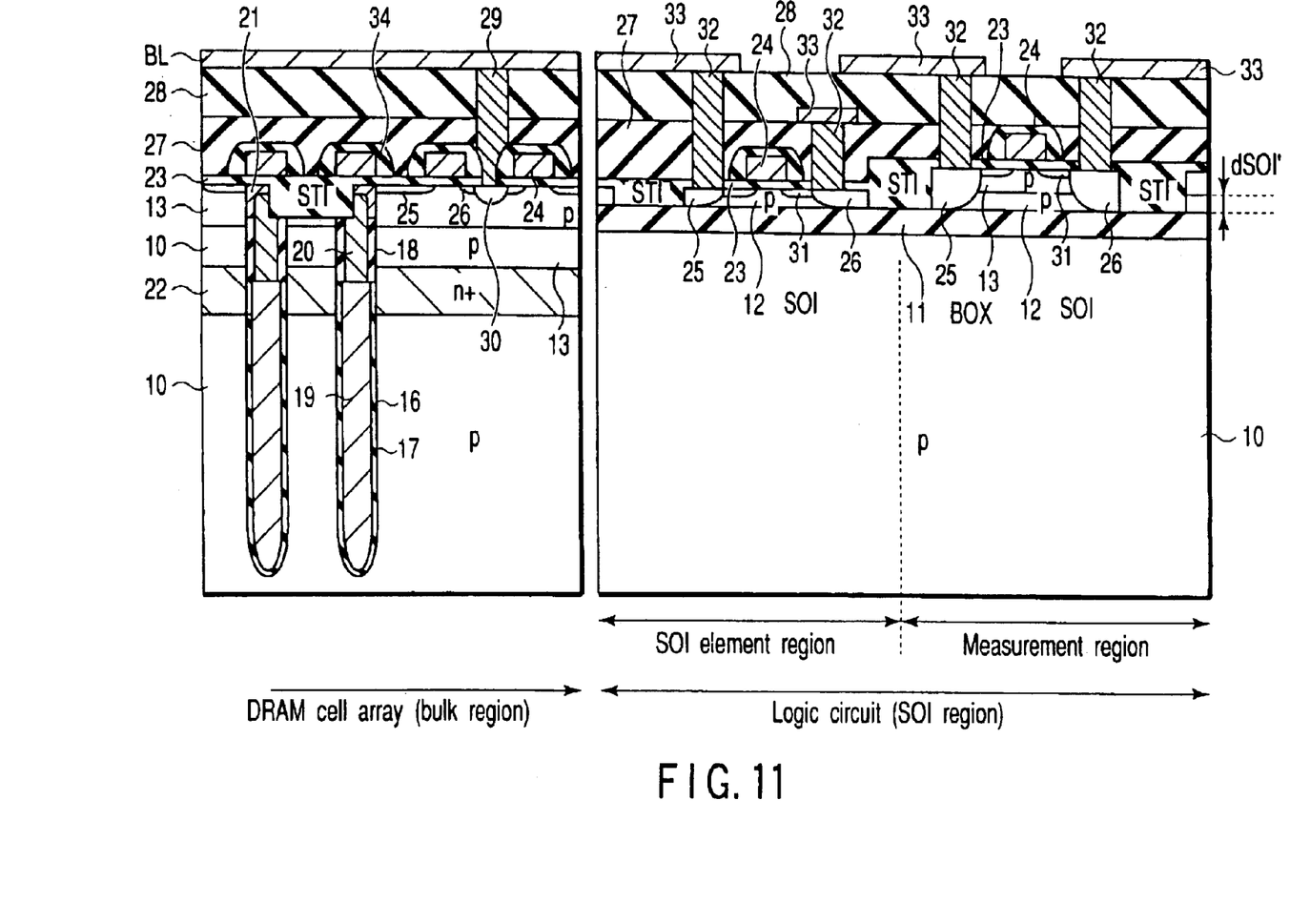
FIG. 11 is a cross-sectional view of a semi-conductor device according to a fifth embodiment of the present invention.

A semiconductor device according to a fifth embodiment of the present invention will now be described with reference to FIG. 11. FIG. 11 is a cross-sectional view of a system LSI embedded a DRAM.

As illustrated in FIG. 11, the LSI according to the fifth embodiment is so formed that, in the LSI according to the second and fourth embodiments, the thickness dSOI' of the SOI layer 12 in the SOI region is set smaller than the thickness dSOI of the SOI layer in the second and fourth embodiments and the source and drain regions 25 and 26 of the MOS transistor in the measurement region reach the BOX layer 11. A fully-depleted type MOS transistor is formed in the SOI element region, and a partially-depleted type MOS transistor is formed in the measurement region.

The advantage (1) described in the first embodiment and the advantage (3) described in the second embodiment can be obtained from the LSI according to the fifth embodiment. Furthermore, the advantage (4) described in the third embodiment can also be obtained by decreasing the thickness of the silicon layer 13 in the measurement region. In addition to the advantages (1), (2) and (4), an advantage (5) that the LSI can be increased in performance by forming a fully-depleted type MOS transistor and a partially-depleted type MOS transistor separately from each other. The advantage (5) will be described in detail below.

Figure 12A:
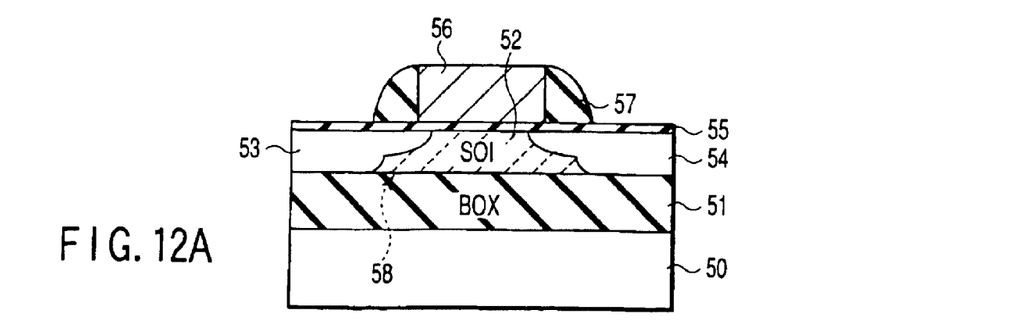
FIG. 12A is a cross-sectional view of a fully-depleted type MOS transistor.
Figure 12B:
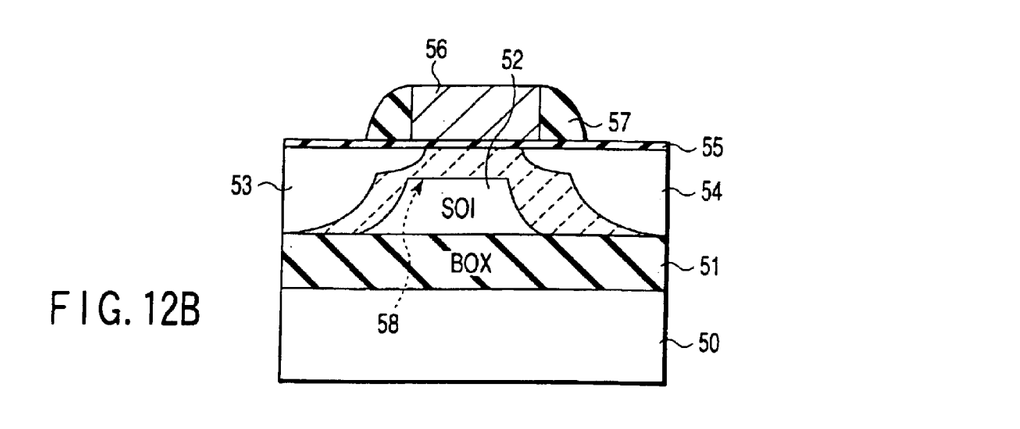
FIG. 12B is a cross-sectional view of a partially-depleted type MOS transistor.

First, the fully-depleted and partially-depleted type MOS transistors will be described with reference to FIGS. 12A and 12B. FIG. 12A is a cross-sectional view of the fully-depleted type MOS transistor and FIG. 12B is a cross-sectional view of the partially-depleted type MOS transistor. As shown in these figures, the SOI substrate includes a silicon substrate 50, a BOX layer 51, and an SOI layer 52. The SOI layer 52 includes source and drain regions 53 and 54 that reach the BOX layer 11 from the surface of the SOI layer 52. A gate electrode 56 is provided on the SOI layer 52 with a gate insulation film 55 interposed therebetween, and an insulation film 57 is provided on the sidewall of the gate electrode 56. As illustrated in FIG. 12A, when the fully-depleted type MOS transistor operates, the whole of a body region (p-type SOI layer 52) is filled with a depletion layer by a pn junction between the source and drain regions 53 and 54 and the body region and an MIS junction of the gate electrode 56, gate insulation film 55 and body region. In other words, all except the source and drain regions 53 and 54 in the SOI layer 52 is depleted. In the partially-depleted type MOS transistor, there remains a non-depleted region in the SOI layer 52 as shown in FIG. 12B.

Figure 12C:
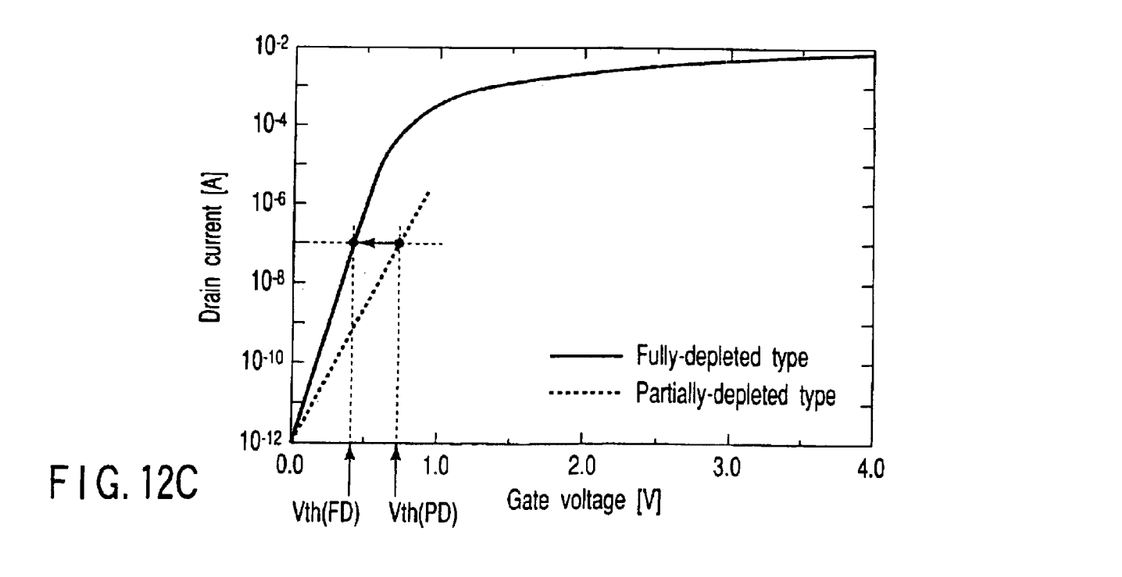
FIG. 12C is a graph showing a relationship between a gate voltage and a drain current in each of the fully-depleted and partially-depleted type MOS transistors.

Comparing the above fully-depleted and partially-depleted type MOS transistors, the former is superior in current supply capability to the latter. This feature will be described with reference to FIG. 12C. FIG. 12C is a graph showing gate voltage-drain current characteristic of the fully-depleted and partially-depleted type MOS transistors.

The rate of increase of the drain current with respect to the gate voltage in a subthreshold region (the inclination of the graph) is represented by a value called an S-factor. The S-factor indicates a reciprocal of the inclination of the gate voltage-drain current characteristic. The smaller the S-factor, the greater the inclination of the graph, which implies that the current supply capability of the MOS transistors is high. The S-factor Sfac is given by the following equation:

$$Sfac = (kB \cdot T/q) \cdot ln10 \cdot (1 + Cdep/Cox)$$

where kB is Boltzmann constant, T is temperature, q is electron charge, Cdep is depletion-layer capacitance, and Cox is gate insulation film capacitance. A difference between the fully-depleted type and partially-depleted type is the depletion-layer capacitance Cdep in the above equation. The depletion-layer capacitance Cdep of the fully-depleted type MOS transistor is much smaller than that of the partially-depleted type MOS transistor. Since, therefore, the S-factor becomes small, the inclination of the gate voltage-drain current characteristic becomes large. As shown in FIG. 12C, the drain current of the fully-depleted type increases more sharply than that of the partially-depleted type. Thus, the threshold voltage Vth (FD) of the fully-depleted type MOS transistor is lower than the threshold voltage Vth (PD) of the partially-depleted type MOS transistor. The drain current is proportionate to $(VDD-Vth)^2$, where VDD is drain voltage and Vth is threshold voltage. In other words, the S-factor decreases in the fully-depleted type MOS transistor. As the S-factor decreases, the threshold voltage Vth lowers. As the threshold voltage Vth lowers, the drain current increases. Consequently, the current supply capability of the MOS transistors is enhanced.

Though the fully-depleted type MOS transistor has the foregoing advantages, it is more difficult to manufacture than the partially-depleted type MOS transistor. As described above, the body region needs to be depleted completely in the fully-depleted type; therefore, the SOI layer on the BOX layer has to be formed very thin. However, to thin the SOI layer to such an extent that the body region can be fully depleted with reliability is very difficult in the current semiconductor process. It is thus very hard to manufacture fully-depleted type MOS transistors with high yields.

As described above, it is desirable that the fully-depleted type MOS transistor be widely used because of its high driving capability; however, the MOS transistor was hard to use in view of fabricating yields. In the LSI according to the fifth embodiment, the silicon layer 13 is provided on the SOI layer 12 in the measurement region. The thickness of the body region of the MOS transistor in the measurement region is greater than that of the body region of the MOS transistor in the SOI element region. In other words, a plurality of MOS transistors having different body thicknesses can be formed in the SOI region. If, therefore, the thickness dSOI' of the SOI layer 12 is thinned in advance to such an extent as to cause a fully-depleted state, a fully-depleted type MOS transistor can selectively be formed only in the SOI element region, whereas a partially-depleted type MOS transistor can be formed in the measurement region. As described above, a fully-depleted type MOS transistor is formed only in an essential part of a region within which a circuit is to be formed of SOI elements, while a partially-depleted type MOS transistor that is easy to manufacture is formed in the other part thereof. Consequently, the LSI can be improved in both fabricating yields and performance.

According to the first to fifth embodiments, the semiconductor device having a patterned SOI structure can produce the following advantages as described above:

(1) Thickness measurement can be simplified;
(2) The floating body effect can be eliminated;
(3) The semiconductor device can be improved in degree of integration;
(4) Photolithography precision can be improved; and
(5) The semiconductor device can be increased in performance.

Figure 13:
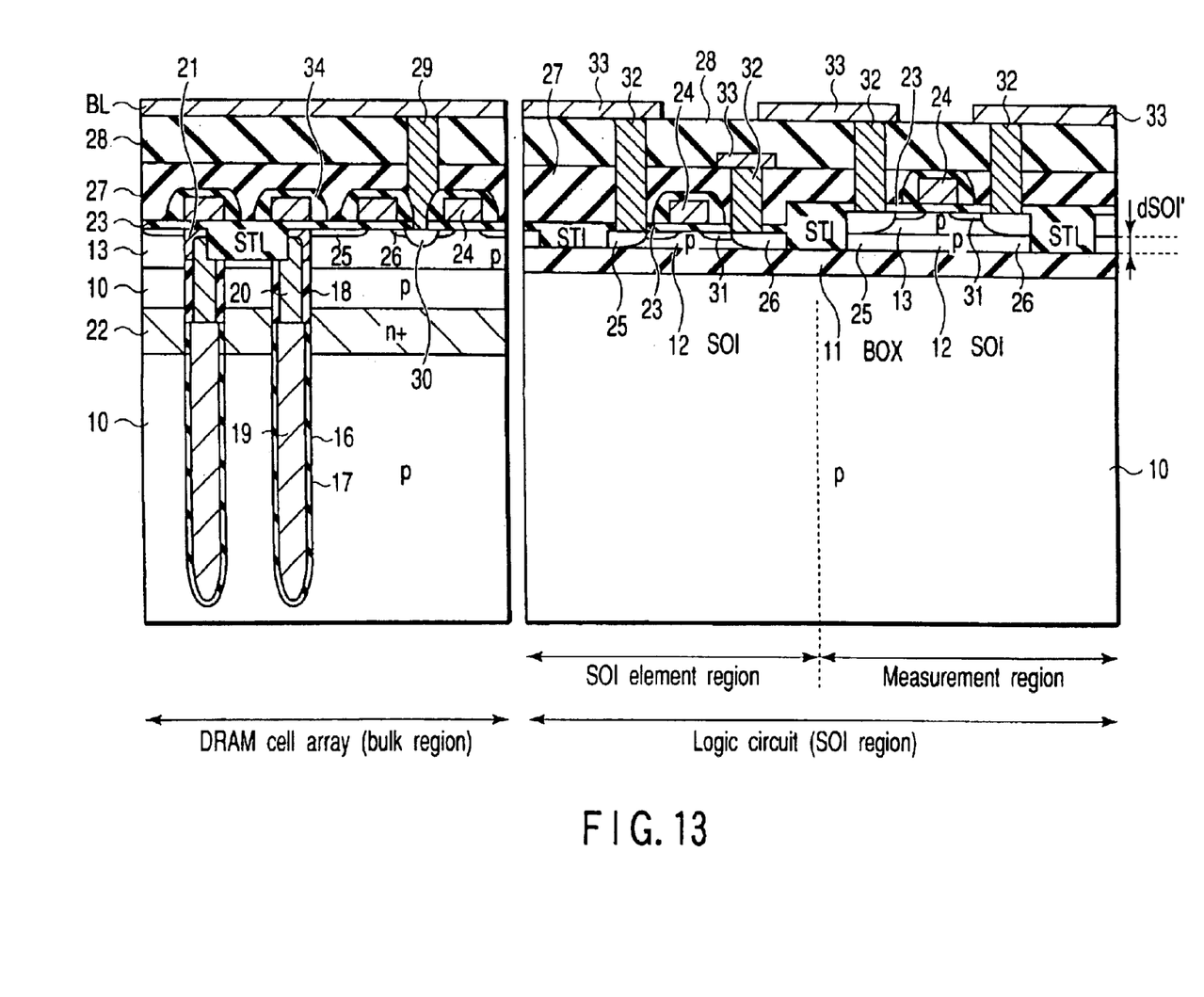
FIG. 13 is a cross-sectional view of a semi-conductor device according to a first modification to the first to fifth embodiments of the present invention.

The present invention is not limited to the above first to fifth embodiments. In the second and fourth embodiments, a detailed description of the MOS transistor formed in the SOI element region is omitted; however, the MOS transistor operates as a partially-depleted type MOS transistor when the thickness of the SOI layer 12 is great. The MOS transistor can be operated as a fully-depleted type MOS transistor by decreasing the thickness of the SOI layer 12 as shown in the section of the LSI in FIG. 13. The embodiments of the present invention have been described taking a DRAM having a trench capacitor as an example. Needless to say, a DRAM having a stacked capacitor can be employed. Moreover, an SRAM (Static RAM), a flash memory, and a ferroelectric RAM can be used. The embodiments of the present invention are not limited to a LSI embedded a memory but can widely be applied to a semiconductor device having a patterned SOI structure.

Figure 14A:
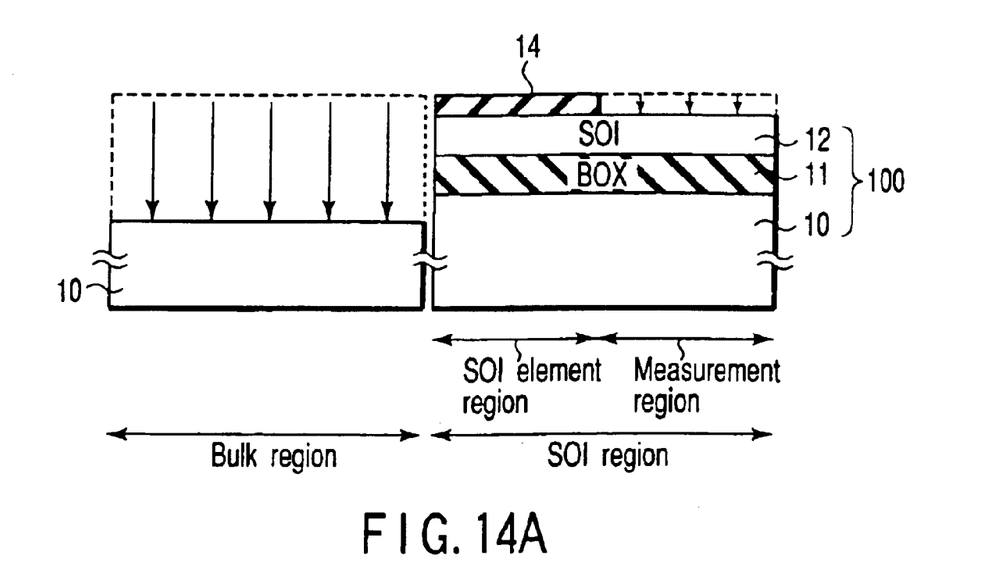
FIGS. 14A and 14B are cross-sectional views showing in sequence a process of fabricating a semiconductor device according to a second modification to the first to fifth embodiments of the present invention.
Figure 14B:
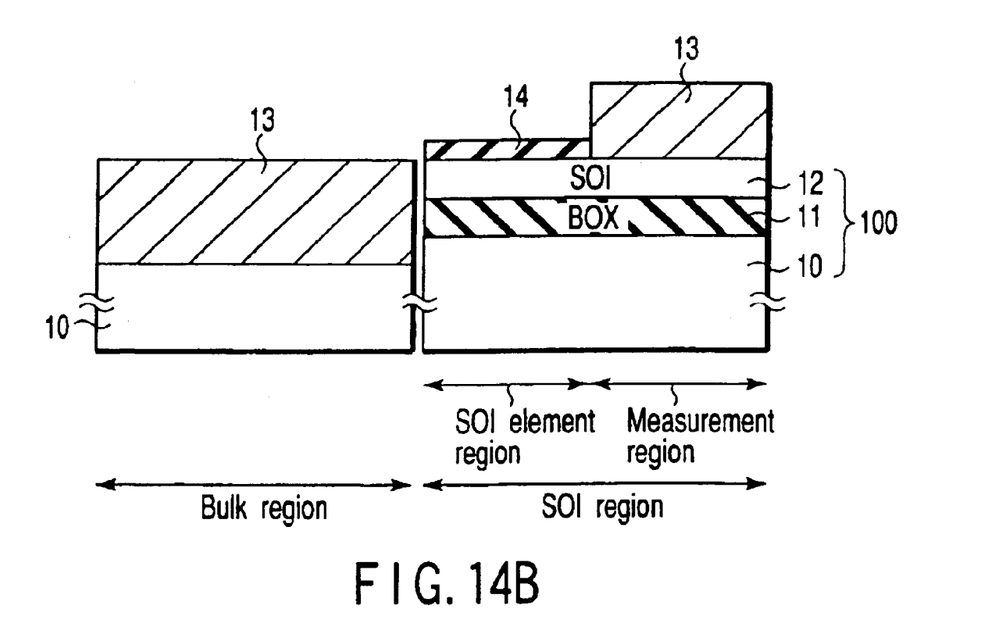

In the foregoing embodiments, the bottom of the silicon layer 13 in the bulk region and that of the BOX layer 11 in the SOI region coincide with each other. However, for example, the bottom of the silicon layer 13 can be located lower than that of the BOX layer 11. This case will be described with reference to FIGS. 14A and 14B. FIGS. 14A and 14B are cross-sectional views showing in sequence part of a process of fabricating a patterned SOI structure. First, the structure shown in FIG. 3C is obtained through the steps described in the first embodiment. Then, as illustrated in FIG. 14A, the BOX layer 11 and part of the silicon substrate 10 in the bulk region are etched. After that, as shown in FIG. 14B, the silicon layer 13 is formed on the silicon substrate 10 and SOI layer 12. Thus, the bottom of the silicon layer 13 is located lower than that of the BOX layer 11 in the SOI region.

To form a plurality of SOI layers having different thicknesses on the same semiconductor substrate is applicable to SOS (silicon on sapphire). In this case, the above advantages (2), (4) and (5) can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for fabricating a semiconductor device comprising:

forming a first insulation film, a first semiconductor layer, and a second insulation film in sequence in first to third regions of a semiconductor substrate;

removing the first insulation film, the first semiconductor layer, and the second insulation film in the first region and the second insulation film in the third region;

selectively forming a second semiconductor layer in the first region of the semiconductor substrate and on the first semiconductor layer in the third region; and removing the second insulation film.

2. The method according to claim 1, further comprising measuring a thickness of the second semiconductor layer in the third region after the second semiconductor layer is formed.

3. The method according to claim 2, wherein the measuring comprises:

measuring a thickness of the first semiconductor layer in the second region by optical means;

measuring a thickness of a layered film of the second semiconductor layer and the first semiconductor layer in the third region by optical means; and subtracting the thickness of the first semiconductor layer from the thickness of the layered film to calculate a thickness of the second semiconductor layer.

4. The method according to claim 2, wherein the measursing comprises optimizing a deposition condition of a next deposition process in a deposition apparatus which forms the second semiconductor layer, based on a measurement result of the thickness of the second semiconductor layer.

5. The method according to claim 1, further comprising polishing the second semiconductor layer in the third region using the second insulation film in the second region as a stopper after the second semiconductor layer is formed.

6. The method according to claim 1, further comprising forming semiconductor elements on the first semiconductor layer and the second semiconductor layer after the second insulation film is removed.

7. The method according to claim 6, wherein at least one of the semiconductor elements formed on the first semiconductor layer is a fully-depleted type MOS transistor, and at least one of the semiconductor elements formed on the second semiconductor layer in the third region is a partially-depleted type MOS transistor.

8. The method according to claim 6, wherein any one of the semiconductor elements formed on the second semiconductor layer in the first region is a DRAM cell.

9. The method according to claim 1, wherein the second insulation film functions as a mask against deposition of the second semiconductor layer, and is formed of materials which prevent the second semiconductor layer from being deposited on the second insulation film.

10. The method according to claim 9, wherein the second insulation film is formed of one of a silicon oxide and a silicon nitride film.

* * * * *